US009190006B2

(12) United States Patent
Ochiai et al.

(10) Patent No.: US 9,190,006 B2
(45) Date of Patent: Nov. 17, 2015

(54) DISPLAY DEVICE HAVING A GATE CIRCUIT WHICH PERFORMS BIDIRECTIONAL SCANNING

(75) Inventors: Takahiro Ochiai, Chiba (JP); Mitsuru Goto, Chiba (JP)

(73) Assignee: JAPAN DISPLAY INC., Tokyo (JP)

( * ) Notice: Subject to any disclaimer, the term of this patent is extended or adjusted under 35 U.S.C. 154(b) by 479 days.

(21) Appl. No.: 13/412,751

(22) Filed: Mar. 6, 2012

(65) Prior Publication Data

US 2012/0229444 A1 Sep. 13, 2012

(30) Foreign Application Priority Data

Mar. 10, 2011 (JP) ................................. 2011-052568

(51) Int. Cl.
*G09G 3/36* (2006.01)
*G11C 19/18* (2006.01)
*G11C 19/28* (2006.01)

(52) U.S. Cl.
CPC ............ *G09G 3/3677* (2013.01); *G11C 19/184* (2013.01); *G11C 19/28* (2013.01); *G09G 2310/021* (2013.01); *G09G 2310/0202* (2013.01); *G09G 2310/0283* (2013.01); *G09G 2310/0286* (2013.01)

(58) Field of Classification Search
CPC .................... G09G 3/3677; G09G 2310/0286; G09G 2310/0202; G09G 2310/0283
USPC ............................................ 345/100; 377/69
See application file for complete search history.

(56) References Cited

U.S. PATENT DOCUMENTS

| 5,859,630 | A | 1/1999 | Huq | |
|---|---|---|---|---|
| 2004/0150610 | A1* | 8/2004 | Zebedee et al. | 345/100 |
| 2004/0217935 | A1* | 11/2004 | Jeon et al. | 345/100 |
| 2007/0052658 | A1* | 3/2007 | Kim | 345/100 |
| 2008/0030445 | A1* | 2/2008 | Choi et al. | 345/87 |
| 2010/0110045 | A1* | 5/2010 | Fu et al. | 345/204 |
| 2010/0118013 | A1* | 5/2010 | Kitayama et al. | 345/211 |
| 2010/0302217 | A1* | 12/2010 | Ochiai et al. | 345/204 |
| 2010/0315402 | A1* | 12/2010 | Hashimoto | 345/211 |
| 2011/0310074 | A1* | 12/2011 | Ochiai et al. | 345/208 |
| 2011/0316831 | A1* | 12/2011 | Ochiai et al. | 345/208 |

FOREIGN PATENT DOCUMENTS

JP 2001-506044 5/2001

* cited by examiner

*Primary Examiner* — John Kirkpatrick
(74) *Attorney, Agent, or Firm* — Lowe Hauptman & Ham, LLP

(57) ABSTRACT

A display device includes a plurality of pixel each including a transistor, a pixel electrode connected to the transistor, and a reference electrode disposed so as to be opposite to the pixel electrode. The display device also includes data lines connected to the corresponding pixel circuits, a plurality of gate lines connected to the corresponding pixel circuits, gate circuits each of which sequentially outputs a gate signal, which is in a high voltage level during two or more horizontal periods in a first order or in a second order that is reverse to the first order, and a gate signal control circuit that controls each of the gate circuits and scans the gate lines. The gate signal control circuit controls each of the gate circuits to start to output the gate signals so as not to overlap periods when the gate signals are output to the adjacent gate lines.

6 Claims, 13 Drawing Sheets

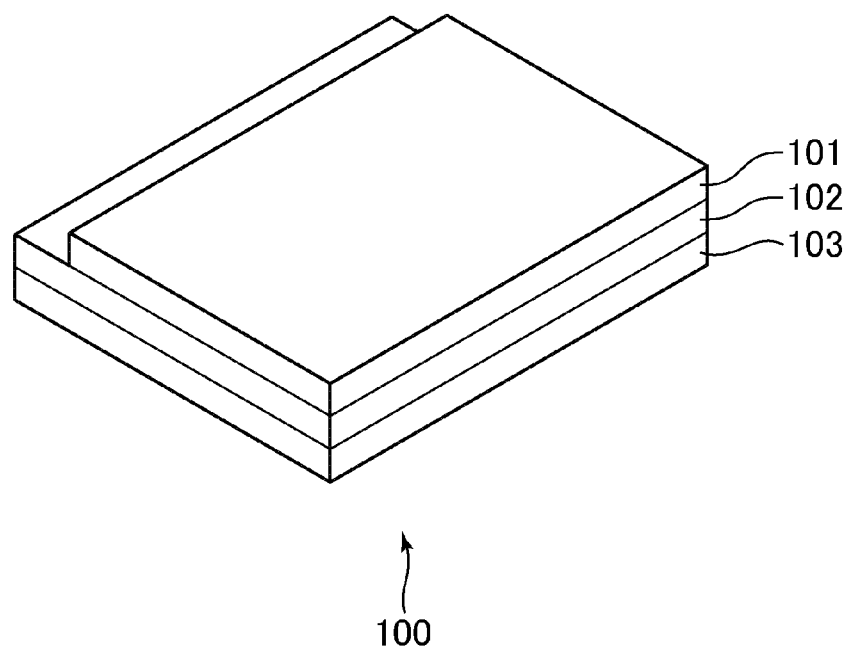
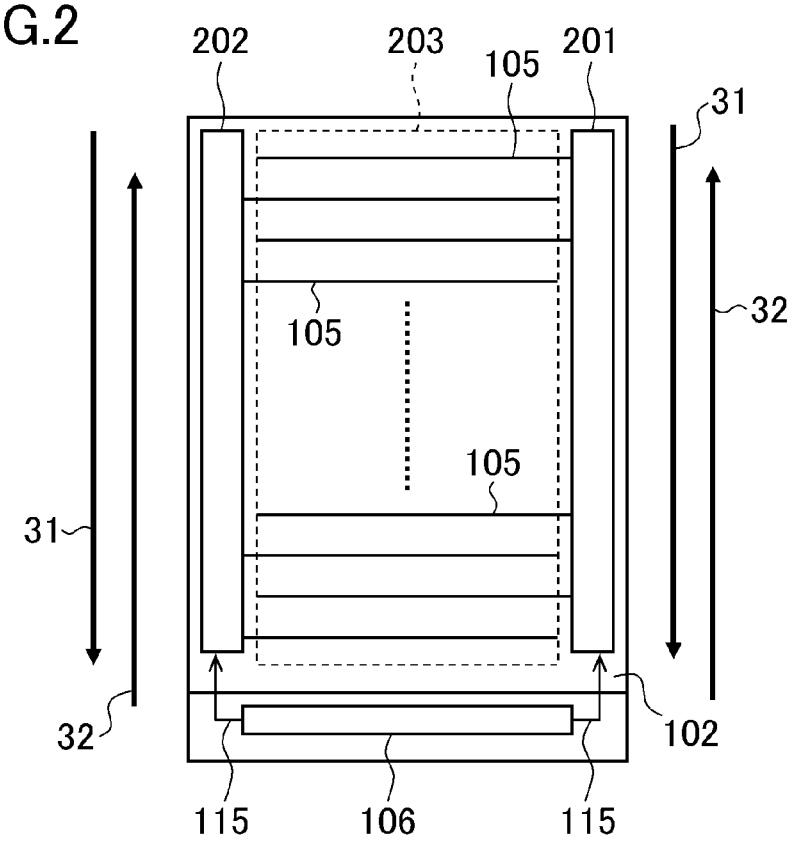

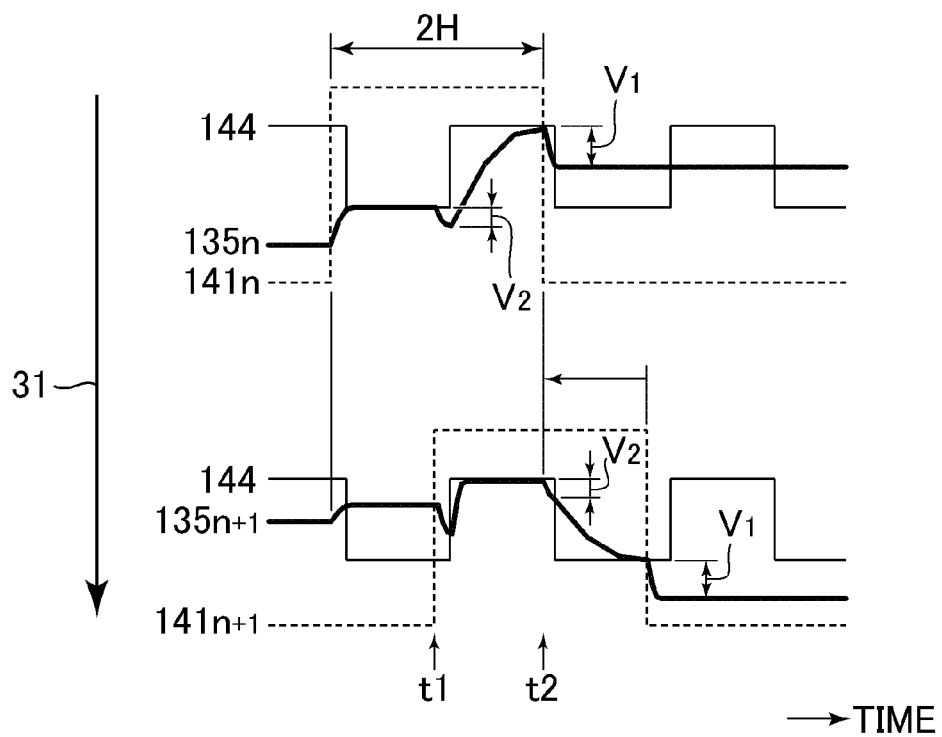
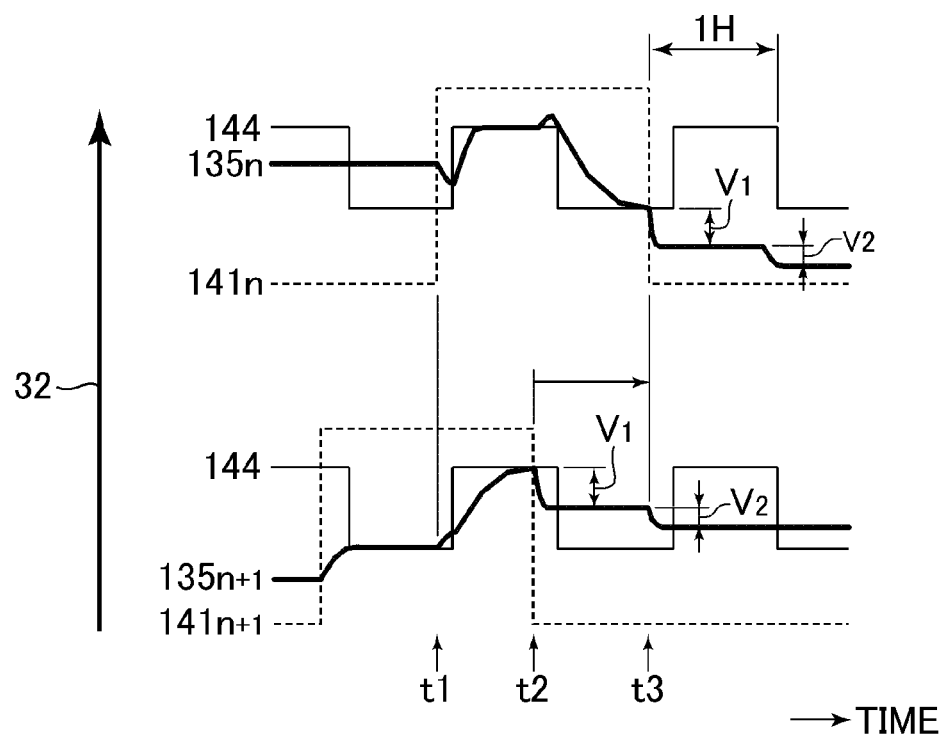

DISPLAY DEVICE HAVING A GATE CIRCUIT WHICH PERFORMS BIDIRECTIONAL SCANNING

CROSS-REFERENCE TO RELATED APPLICATION

The present application claims priority from Japanese Application JP2011-052568 filed on Mar. 10, 2011, the content to which is hereby incorporated by reference into this application.

BACKGROUND OF THE INVENTION

1. Field of the Invention

The present invention relates to a display device having a gate circuit. More particularly, the present invention relates to a display device having a gate circuit which performs bidirectional scanning.

2. Description of the Related Art

There is known a liquid crystal display having a gate circuit which performs bidirectional scanning. In addition, due to recent demands for high resolution, it is difficult to secure sufficient time during one horizontal period (1H), and, in order to correspond thereto, so-called gate overlap driving, in which a turned-on period of the gate signal is longer than one horizontal period (1H), is used. In the gate overlap driving, the turned-on period of the gate signal includes one horizontal period (1H) for actually writing a data signal corresponding to a grayscale value and a previous predetermined period (refer to JP2001-506044T).

SUMMARY OF THE INVENTION

However, in the gate circuit performing bidirectional scanning driving, parasitic capacitance between the gate and source, which is generated in the transistor included in the pixel circuit, may be different between in the case of performing forward scanning driving and in the case of performing backward scanning driving. The voltage of the pixel electrode with respect to a reference electrode becomes different, and thus display quality is deteriorated. Hereinafter, this will be specifically explained with reference to the drawings.

FIG. 13 is a diagram illustrating an outline of the cross-section of the pixel circuit for explaining a task of the present invention. Specifically, an outline of the cross-section of the pixel circuit 130 in a direction parallel to a drain line (not shown) is shown.

As shown in FIG. 13, each pixel circuit 130 includes a gate electrode 131, a semiconductor layer 132, a source electrode 133, and a drain electrode 134 forming a TFT, a pixel electrode 135, and a reference electrode 136. Specifically, for example, the gate electrode 131 is disposed on a transparent substrate 137, and a gate insulating layer 138 is disposed on the gate electrode 131 so as to cover the gate electrode 131. In addition, the semiconductor layer 132 is disposed on the gate insulating layer 138. The source electrode 133 and the drain electrode 134 are disposed on the semiconductor layer 132. The source electrode 133 is connected to the pixel electrode 135, and the reference electrode 136 is laminated on the pixel electrode 135, the source electrode 133, the drain electrode 134, and the like, via an insulating layer 139. In addition, a configuration of the pixel circuit 130 is similar to that of the related art, and thus detailed description thereof will be omitted.

FIG. 14 is a diagram illustrating an equivalent circuit of each pixel circuit shown in FIG. 13. Specifically, FIG. 14 shows an n-th pixel circuit 130 and a (n+1)-th pixel circuit 130 among plural pixel circuits 130 which are sequentially arranged. In addition, in FIG. 14, the arrow 31 indicates a direction where the gate lines are sequentially turned on in the forward driving, and the arrow 32 indicates a direction where the gate lines are sequentially turned on in the backward driving.

As shown in FIG. 14, a gate of the TFT 142, is connected to the n-th gate line $141_n$ among plural gate lines sequentially arranged. The reference electrode 136 is connected to a reference voltage line 143, and a pixel capacitor $C_{st}$ is formed by the pixel electrode 135, and the reference electrode 136. The pixel electrode 135, is disposed so as to be adjacent to the (n−1)-th gate line $141_{n-1}$ and the n-th gate line $141_n$.

Here, from the configuration of the pixel circuit 130 shown in FIG. 13, a parasitic capacitor $C_{gp1}$ occurs between the pixel electrode 135, and the n-th gate line $141_n$, and a parasitic capacitor $C_{gp2}$ occurs between the pixel electrode 135, and the (n−1)-th gate line $141_{n-1}$. Therefore, a gate signal output to each of the gate lines 141 adjacent to the pixel electrode 135 is varied from a turned-on voltage to a turned-off voltage, and, accordingly, a storage voltage stored in the pixel capacitor $C_{st}$ is varied due to coupling with the parasitic capacitor occurring between the gate line and the pixel electrode 135. In other words, a voltage of the pixel electrode 135 with respect to the reference electrode 136 is varied, and this will be described later in detail. In addition, in the following description, a voltage reduced by the parasitic capacitor $C_{gp1}$ is denoted by $V_1$, and a voltage reduced by the parasitic capacitor $C_{gp2}$ is denoted by $V_2$.

First, a variation in the voltage of the pixel electrode 135 when the forward driving is performed will be described with reference to FIG. 15 assuming two-horizontal period overlap driving. Here, one horizontal period (1H) corresponds to a period when display data is written in a single pixel circuit 130.

As described above, because the two-horizontal period overlap driving is assumed, as shown in FIG. 15, data writing in the (n−1)-th pixel circuit 130 is finished at the time point t1 when the first half horizontal period (1H) of two horizontal periods (2H), in which a voltage of the n-th gate line 141, is a high voltage, is finished. Therefore, at the time t1, a voltage of the (n−1)-th gate line $141_{n-1}$ is varied from the high voltage to the low voltage.

Accordingly, in the n-th pixel circuit 130, a voltage is reduced by the voltage $V_2$ due to the parasitic capacitor $C_{gp2}$ present between the pixel electrode 135, and the (n−1)-th gate line $141_{n-1}$. In addition, at this time t1, a data signal starts to be input to the n-th pixel circuit 130, and thus a display voltage supplied to the data signal line 144 is varied to a display voltage supplied to the n-th pixel circuit 130.

Here, at the time point t1, the voltage is reduced by the voltage $V_2$ due to the parasitic capacitor $C_{gp2}$, but since a voltage of the pixel electrode 135, becomes close to the display voltage according to display data of the n-th pixel circuit 130 during the second half horizontal period, there is little influence by the reduction of the voltage $V_2$.

At the time point t2 when the second half horizontal period (1H) is finished, data writing in the n-th pixel circuit 130 is finished. Therefore, at the time point t2, a voltage of the n-th gate line 141, is varied from the high voltage to the low voltage. At this time, the voltage is reduced by the voltage $V_1$ due to the parasitic capacitor $C_{gp1}$ present between the pixel electrode $135_n$ and the n-th gate line $141_n$ in the n-th pixel circuit 130, and the voltage of the n-th pixel electrode $135_n$ is maintained at a voltage lower than a desired display voltage by the voltage $V_1$.

In addition, at the time point t2, a data signal starts to be input to the (n+1)-th pixel circuit 130 in the same manner. Here, since a case of using inversion driving is assumed, signs of the input data signals in the n-th and (n+1)-th pixel circuits 130 are different from each other, and other elements are the same, and thus description thereof will be omitted.

As described above, in a case of the forward driving, a voltage of the pixel electrode 135 of each pixel circuit 130 is maintained at a voltage lower than a desired display voltage by the voltage $V_1$.

Next, driving in a case of performing backward scanning driving will be described with reference to FIG. 16. As described above, since the two-horizontal period overlap driving is assumed, in the (n+1)-th pixel circuit 130, data writing in the (n+2)-th pixel circuit 130 is finished at the time point t1 when the first half horizontal period (1H) of two horizontal periods (2H), in which a voltage of the (n+1)-th gate line $141_{n+1}$ is a high voltage, is finished. Therefore, at the time t1, a voltage of the (n+2)-th gate line $141_{n+2}$ is varied from the high voltage to the low voltage.

However, in the (n+1)-th pixel circuit 130, a value of the parasitic capacitor occurring between the pixel electrode $135_{n+1}$ and the (n+2)-th gate line $141_{n+2}$ is smaller than that of the parasitic capacitor $C_{gp1}$ occurring between the pixel electrode $135_{n+1}$ and the (n+1)-th gate line $141_{n+1}$, or the parasitic capacitor $C_{gp2}$ occurring between the pixel electrode $135_{n+1}$ and the n-th gate line $141_n$, as can be seen from FIG. 13, and thus a voltage variation is small at this time point. In addition, during the second half one horizontal period (1H), a voltage of the pixel electrode $135_{n+1}$ becomes close to the display control voltage according to display data of the (n+1)-th pixel circuit 130, and thus there is little influence by the voltage variation.

At the time point t1, the display voltage supplied to the data signal line 144 is varied to a display voltage supplied to the (n+1)-th pixel circuit 130. At the time point t2 when the second half one horizontal period (1H) is finished, data writing in the (n+1)-th pixel circuit 130 is finished.

At the time point t2, a voltage of the (n+1)-th gate line $141_{n+1}$ is varied from the high voltage to the low voltage. Accordingly, in the (n+1)-th pixel circuit 130, a voltage of the pixel electrode $135_{n+1}$ is reduced by the voltage $V_1$ due to the parasitic capacitor $C_{gp1}$ present between the pixel electrode $135_{n+1}$ and the (n+1)-th gate line $141_{n+1}$.

At a time point t3 later than the time point t2 by one horizontal period (1H), a voltage of the n-th gate line $141_n$ is varied from the high voltage to the low voltage. Accordingly, a voltage of the pixel electrode $135_{n+1}$ is further reduced by the voltage $V_2$ due to the parasitic capacitor $C_{gp2}$ present between the pixel electrode $135_{n+1}$ and the n-th gate line $141_n$.

In addition, at the time point t2, a data signal starts to be input to the n-th pixel circuit 130 in the same manner. Here, since a case of using inversion driving is assumed, signs of the input data signals in the n-th and (n+1)-th pixel circuits 130 are different from each other, and other elements are the same, and thus description thereof will be omitted.

That is to say, in a case of the backward scanning, a voltage of the pixel electrode 135 of each pixel circuit 130 is maintained at a voltage lower than a desired display voltage by the voltage $V_1$ and the voltage $V_2$.

As explained above, in the case of performing the forward scanning driving and the backward scanning driving, a difference occurs in the voltages of the pixel electrode 135 with respect to the reference electrode 136, and thus display quality is deteriorated.

In light of the problems as explained above, and an object of one or more embodiments of the present invention is to provide a display device which suppresses influence by a difference in storage voltages of the pixel circuit 130, occurring in a case of forward scanning driving and in a case of backward scanning driving, and improves display quality.

(1) In one or more embodiments of the present invention, a display device includes a plurality of pixel circuits each of which includes a transistor, a pixel electrode connected to the transistor, and a reference electrode disposed so as to be opposite to the pixel electrode. The plurality of pixel circuits are arranged in a matrix. The display device also includes a plurality of data lines respectively connected to the plurality of corresponding pixel circuits, a plurality of gate lines respectively connected to the plurality of corresponding pixel circuits, a plurality of gate circuits each of which sequentially outputs a gate signal, which is in a high voltage level during two or more horizontal periods in a first order or in a second order that is reverse to the first order. The number of the plurality of gate circuits is based on horizontal periods when the gate signals are output. The display device further includes a gate signal control circuit that controls each of the gate circuits and scans the plurality of gate lines. The gate signal control circuit controls each of the gate circuits to start to output the gate signals so as not to overlap periods when the gate signals are output to the adjacent gate lines.

(2) In the display device set forth in (1), each of the gate circuits includes a first gate circuit that sequentially outputs the gate signals to odd numbered gate lines of the plurality of gate lines and a second gate circuit that sequentially outputs the gate signals to even numbered gate lines of the plurality of gate lines. The second gate circuit starts to output the gate signals after the first gate circuit outputs a second gate signal.

(3) In the display device set forth in (1), each of the plurality of gate circuits includes a first gate circuit that sequentially outputs the gate signals to k-th gate lines of the plurality of gate lines, a second gate circuit that sequentially outputs the gate signals to (k+1)-th gate lines of the plurality of gate lines, and a third gate circuit that sequentially outputs the gate signals to (k+2)-th gate lines of the plurality of gate lines. The second gate circuit starts to output the gate signals after the first gate circuit outputs a second gate signal. The third gate circuit starts to output the gate signals after the second gate circuit outputs a second gate signal.

(4) In the display device set forth in (3), the first, second, and third gate circuits are included in two gate circuits disposed at left and right sides of a pixel region in which the plurality of pixel circuits are provided.

(5) In the display device set forth in any one of (1) to (4), each of the gate circuits is connected to four clock signal lines to which clock signals of four phases are respectively input. The clock signals sequentially becoming a high voltage level in the first order or in the second order. Each of the gate circuits includes a plurality of basic circuits that sequentially output the gate signal. Where each of the gate circuits sequentially outputs the gate signals in the first order, and where the basic circuit outputting a k-th gate signal is a k-th basic circuit of the plurality of basic circuits, one of the four-phase clock signals is an m-th clock signal, and a period when the gate signal becomes a high voltage level is a horizontal period 1, the k-th basic circuit includes a first transistor that controls a voltage of a first node depending on an output from a (k−1)-th basic circuit, a second transistor that controls a second node to become a low voltage level when the first node is in a high voltage level, a third transistor that applies a high voltage to an output terminal according to a high voltage level of the m-th clock signal, a fourth transistor that controls a voltage of the first node depending on an output from a (k+2)-th basic circuit, a fifth transistor that controls the second node to become a high voltage level according to a high voltage level of a (m+2*1)-th clock signal, a sixth transistor that controls the output terminal to become a low voltage level when the second node is in a high voltage level, a seventh transistor that controls a voltage of the first node depending on an output from a (k−2)-th basic circuit, and an eighth transistor that controls a voltage of the first node depending on an output from a (k+1)-th basic circuit.

(6) In the display device set forth in any one of (1) to (5), where each of the gate circuits sequentially outputs the gate signals in the first order, the first transistor controls the first node to become a high voltage level according to an output from the (k−1)-th basic circuit, and the fourth transistor controls the first node to become a low voltage level according to an output from the (k+2)-th basic circuit. Where each of the gate circuits sequentially outputs the gate signals in the second order, the eighth transistor controls the first node to become a high voltage level according to an output from the (k+1)-th basic circuit, and the seventh transistor controls the first node to become a low voltage level according to an output from the (k−2)-th basic circuit.

(7) In the display device set forth in any one of (1) to (6), the n-th basic circuit further includes a bootstrap circuit that further increases a high voltage value of the first node according to a high voltage level of the m-th clock signal.

(8) In the display device set forth in (1) to (7), wherein the n-th basic circuit further includes a storage capacitor that stores a high voltage of the second node until the second node becomes a low voltage level.

BRIEF DESCRIPTION OF THE DRAWINGS

FIG. 1 is a diagram illustrating an outline of the display device according to an embodiment of the present invention.

FIG. 2 is a diagram illustrating disposition of the gate circuit according to the embodiment of the present invention.

FIG. 15 is a diagram illustrating a task of the present invention.

FIG. 16 is a diagram illustrating a task of the present invention.

DETAILED DESCRIPTION OF THE INVENTION

Figure 3:
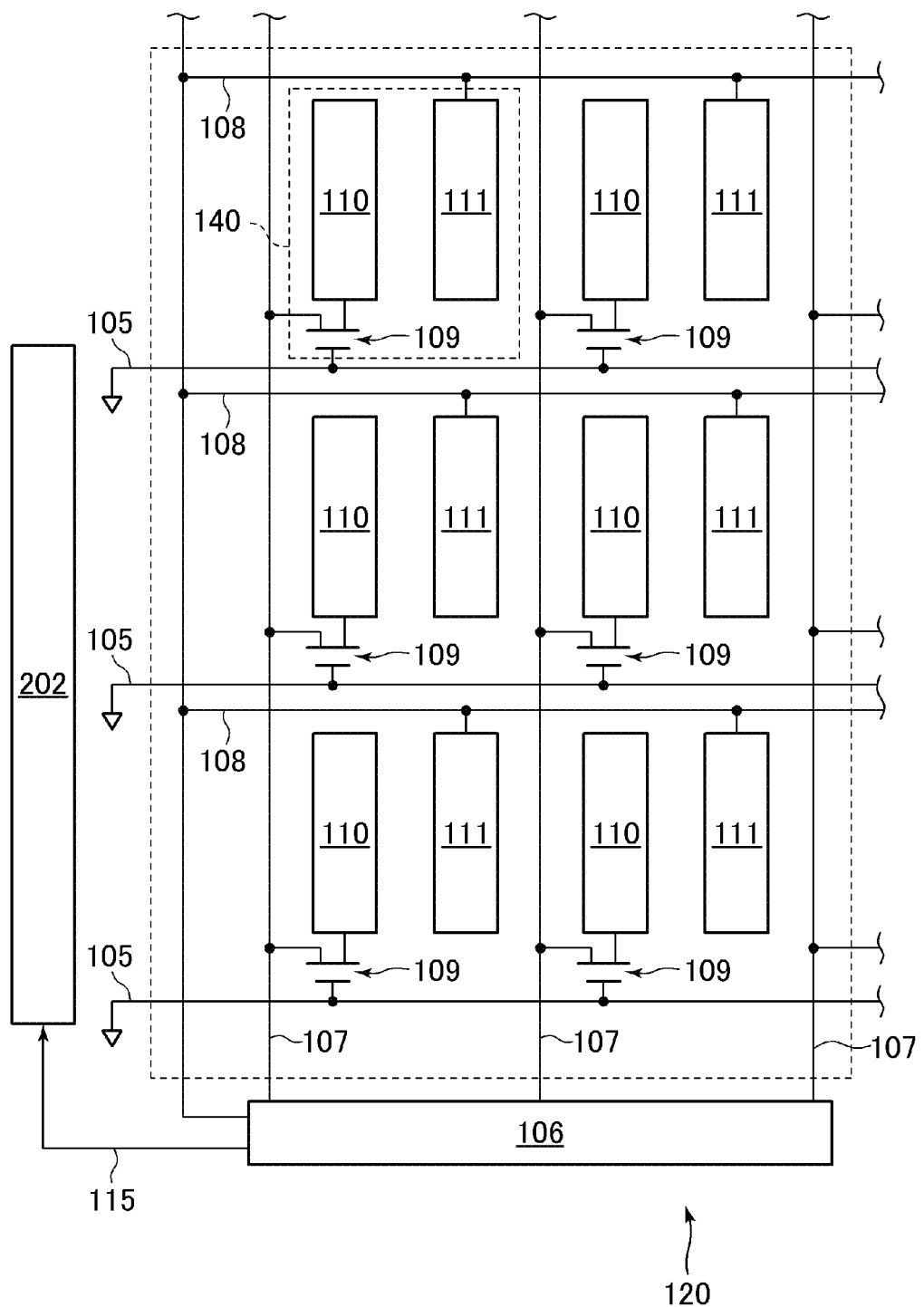
FIG. 3 is a diagram illustrating an outline of the pixel circuit formed on the TFT substrate according to the embodiment of the present invention.

FIG. 1 is a diagram illustrating an outline of the display device according to an embodiment of the present invention. As shown in FIG. 1, for example, a display device 100 includes a TFT substrate 102 provided with TFTs (not shown) and the like, and a filter substrate 101 which is opposite to the TFT substrate 102 and is provided with color filters (not shown). In addition, the display device 100 includes a liquid crystal material (not shown) which is sealed in a region interposed between the TFT substrate 102 and the filter substrate 101, and a backlight 103 which is located so as to come into contact with an opposite side to the filter substrate 101 side of the TFT substrate 102.

FIG. 2 is a diagram illustrating disposition of the gate circuit according to the embodiment. As shown in FIG. 2, for example, a first gate circuit 201 and a second gate circuit 202 are disposed at both sides of a display portion 203 including plural pixel circuits arranged in a matrix. As described later, for example, the first gate circuit 201 disposed on the right side of the display portion 203 outputs a gate signal to odd numbered gate lines 105, and the second gate circuit 202 disposed on the left side of the display portion 203 outputs a gate signal to even numbered gate lines 105. Details thereof will be described later.

FIG. 3 is a diagram illustrating an outline of the pixel circuit formed on the TFT substrate. As shown in FIG. 3, the TFT substrate 102 includes plural gate lines 105 which are arranged with the substantially equal interval in the horizontal direction of FIG. 3, and plural data lines 107 which are arranged with the substantially equal interval in the vertical direction of FIG. 3. The gate lines 105 are connected to the corresponding gate circuits 201 and 202, and the data lines 107 are connected to a driver 106.

The gate circuits 201 and 202 have plural basic circuits (not shown) respectively corresponding to plural gate lines 105. In addition, each of the basic circuits outputs a gate signal which becomes a high voltage during a gate scanning period (high signal period) and becomes a low voltage during the remaining period (low signal period) in one frame period, to the corresponding gate line 105, in response to control signals 115 from a driver 106, and details thereof will be described later. In FIG. 3, this is also the same for the first gate circuit 201 although only the second gate circuit 202 disposed on the left side is shown.

Each of pixel regions 140 partitioned in a matrix by the gate lines 105 and the data lines 107 includes a TFT 109, a pixel electrode 110, and a reference electrode 111. Here, a gate of the TFT 109 is connected to the gate line 105, a drain thereof is connected to the data line 107, and a source thereof is connected to the pixel electrode 110. In addition, the reference electrode 111 is connected to a common signal line 108, and the pixel electrode 110 is opposite to the reference electrode 111.

Next, an operation of the pixel circuit having the above-described configuration will be described. The driver 106 applies a reference voltage to the reference electrode 111 via the common signal line 108. The gate circuit 202 controlled by the driver 106 outputs a gate signal to the gate electrode 131 of the TFT 109 via the gate line 105. In addition, the driver 106 supplies a video signal voltage to the TFT 109 with which the gate signal has been supplied, via the data line 107, and the video signal voltage is applied to the pixel electrode 110. At this time, a potential difference occurs between the pixel electrode 110 and the reference electrode 111.

The driver 106 controls a potential difference occurring between the pixel electrode 110 and the reference electrode 111, and the driver 106 controls alignment or the like of liquid crystal molecules of the liquid crystal material. Here, light from the backlight 103 is guided to the liquid crystal material, and the alignment or the like of the liquid crystal molecules is controlled as described above so as to control a light amount from the backlight 103, resulting in displaying images.

Figure 4:
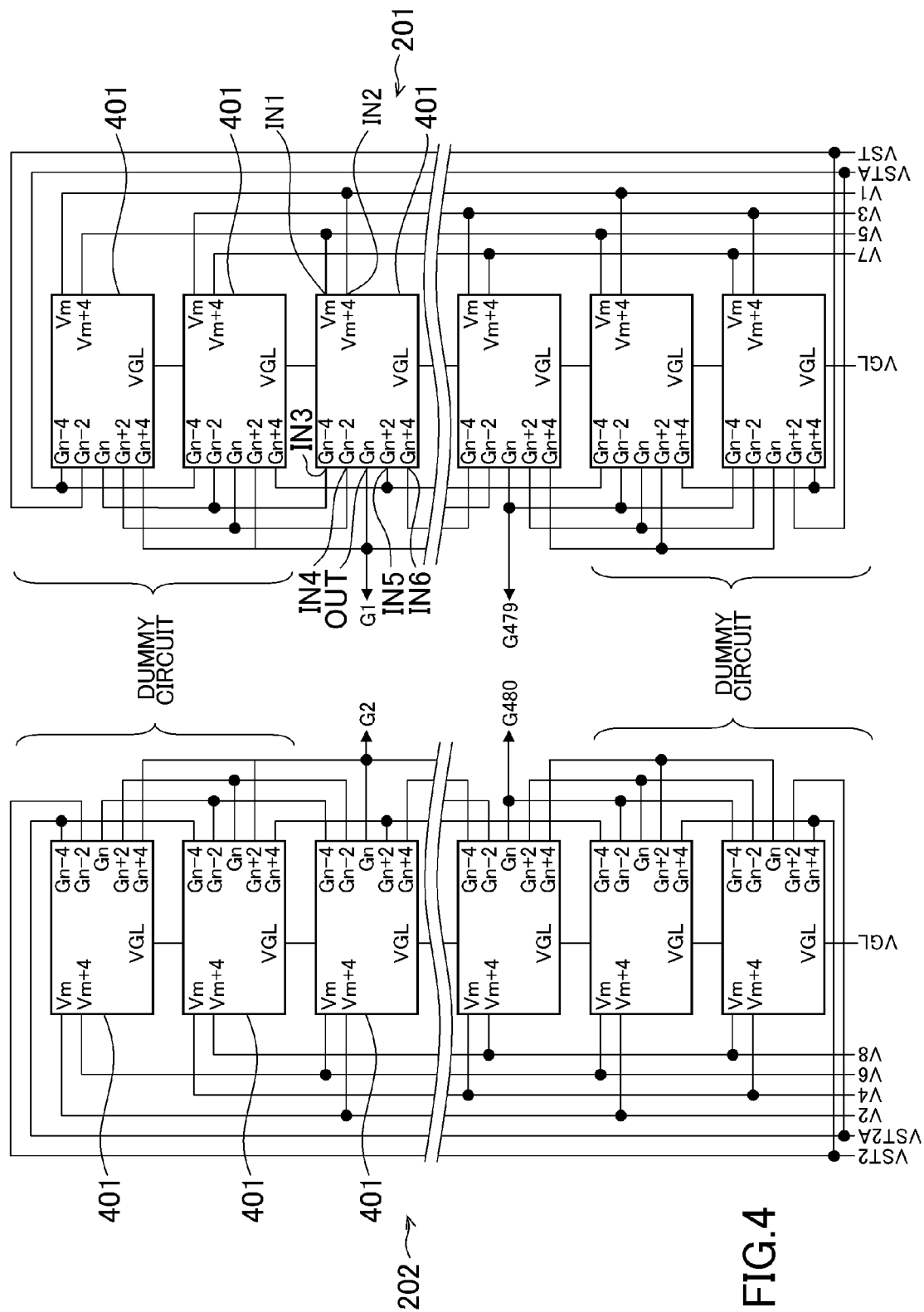
FIG. 4 is a diagram illustrating a configuration of the gate circuit according to the embodiment of the present invention.

FIG. 4 is a diagram illustrating a configuration of the gate circuit. As shown in FIG. 4, each basic circuit 401 has input terminals IN1, IN2, IN3, IN4, IN5 and IN6, and an output terminal OUT. The driver 106 inputs control signals 115 to the input terminals IN1 and IN2.

Here, the control signals 115 include, for example, basic clock signals $V_1$, $V_3$, $V_5$ and $V_7$ which are input to the odd numbered basic circuits 401 outputting gate signals to the odd numbered gate lines of the sequentially arranged gate lines and which have different phases of four phases, a low voltage line $V_{GL}$, and auxiliary signals $V_{ST}$ and $V_{ST4}$. In addition, the control signals 115 include, for example, basic clock signals $V_2$, $V_4$, $V_6$ and $V_8$ which are input to the even numbered basic circuits 401 outputting gate signals to the even numbered gate lines of the sequentially arranged gate lines and which have different phases of four phases, the low voltage line $V_{GL}$, and auxiliary signals $V_{ST2}$ and $V_{ST2A}$. In addition, the odd numbered basic circuits 401 constitute the first gate circuit 201, and the even numbered basic circuits 401 constitute the second gate circuit 202. In addition, the gate signal control circuit in the claims is included in, for example, the driver 106.

Basic clock signals $V_m$ and $V_{m+4}$ are respectively input to the input terminals IN1 and IN2 of the n-th basic circuit 401-*n*. In addition, a gate signal $G_{n-2}$ from the (n−2)-th basic circuit 401-(*n*−2) is input to the input terminal IN3 of the n-th basic circuits 401-*n*, and a gate signal $G_{n-4}$ from the (n−4)-th basic circuit 401-(*n*−4) is input to the input terminal IN4 thereof. In addition, a gate signal $G_{n+2}$ from the (n+2)-th basic circuit 401-(*n*+2) is input to the input terminal IN5 of the n-th basic circuit 401-*n*, and a gate signal $G_{n+4}$ from the (n+4)-th basic circuit 401-(*n*+4) is input to the input terminal IN6 thereof. Here, the n-th basic circuit corresponds to a basic circuit outputting a gate signal to the n-th gate line 105.

Since there are no gate signals corresponding to the input terminals IN3 and IN4 of the first basic circuit 401 (a basic circuit located at the uppermost part of the figure) of plural basic circuits 401 included in each of the gate circuits 201 and 202, the auxiliary signals $V_{ST4}$ and $V_{ST}$ are respectively input thereto. In addition, in the same manner, since there is no gate signal corresponding to the input terminal IN3 of the second basic circuit 401, the auxiliary signal $V_{ST}$ is input thereto. Since there are no gate signals corresponding to the input terminals IN5 and IN6 of the last basic circuit 401 (a basic circuit located at the lowermost part of the figure) of plural basic circuits 401 included in each of the gate circuits, the auxiliary signals $V_{ST}$ and $V_{ST4}$ are respectively input thereto. In addition, in the same manner, since there is no gate signal corresponding to the input terminal IN6 of the second basic circuit 401 from the last, the auxiliary signal $V_{ST}$ is input thereto. This is also the same for the even numbered basic circuits 401, and thus description thereof will be omitted. Although 480 gate lines 105 and the basic circuits 401 corresponding thereto are shown in FIG. 4, the present invention is not limited thereto, and other numbers of gate lines 105 may be employed.

Figure 5:
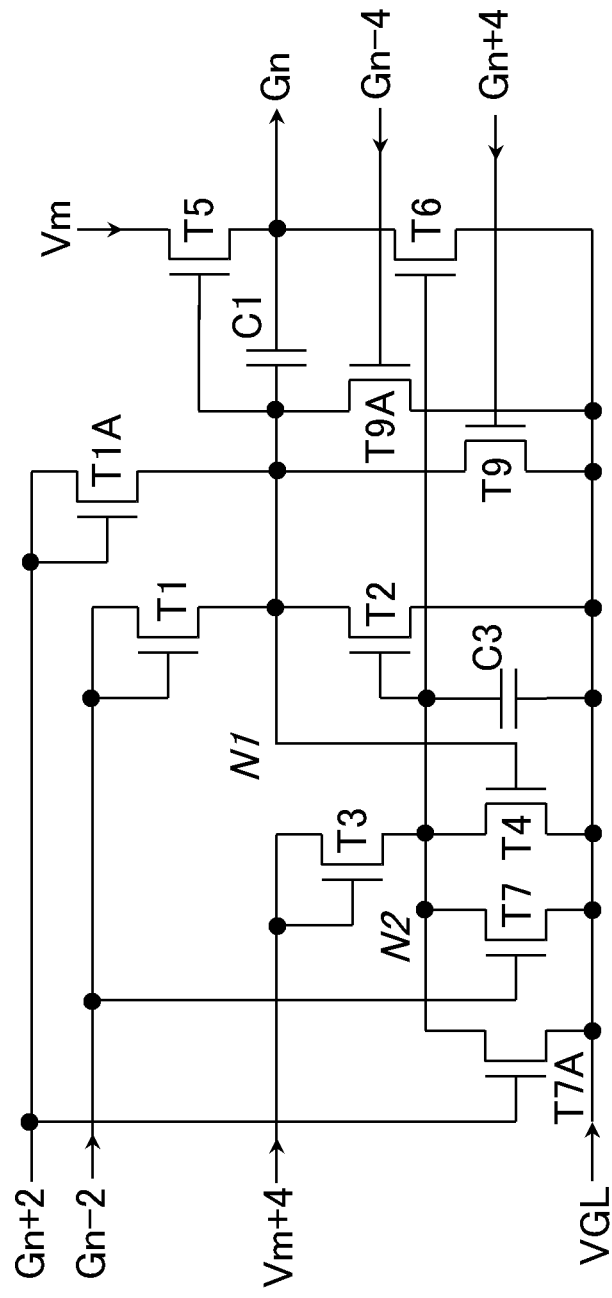
FIG. 5 is a diagram illustrating an example of the configuration of the n-th basic circuit according to the embodiment of the present invention.
Figure 6:
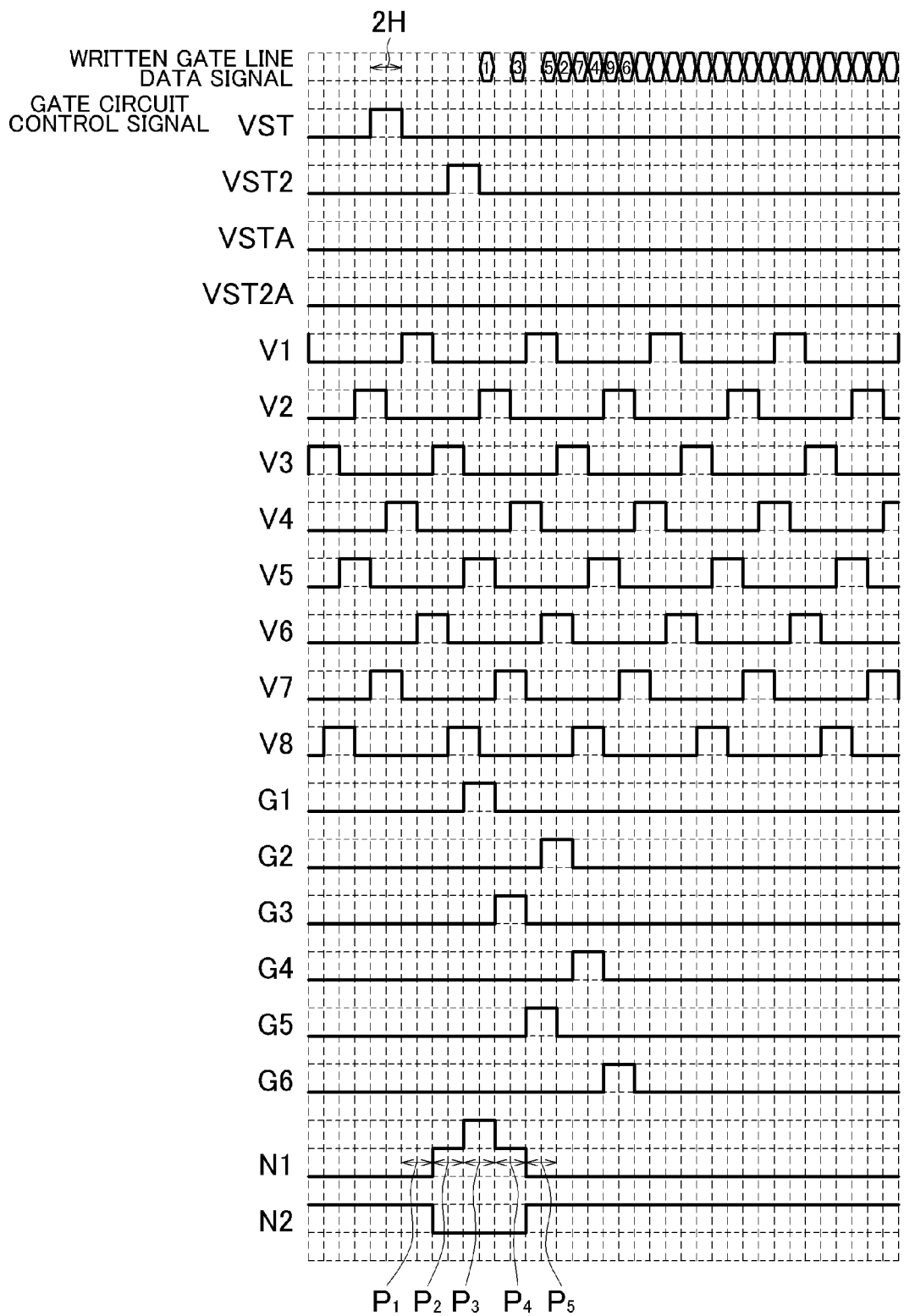
FIG. 6 is a diagram illustrating a timing chart when the gate circuit performs forward scanning according to the embodiment of the present invention.

Next, a configuration and an operation of the n-th basic circuit will be described. FIG. 5 is a diagram illustrating an example of the configuration of the n-th basic circuit. FIG. 6 is a diagram illustrating a timing chart when the gate circuits perform forward scanning. In FIG. 6, VST, VSTA, V1, V3, V5, and V7 indicate signals in the first gate circuit 201, and VST2, VST2A, V2, V4, V6, and V8 indicate signals used in the second gate circuit 202. In addition, N1 and N2 respectively indicate voltages of a node N1 and a node N2. G1 to G6 respectively indicate gate signals output to the first to sixth gate lines 105. Details of the signals will be described later.

First, a case where each of the gate circuits 201 and 202 perform forward scanning will be described. During the period P1, since the gate signal $G_{n-4}$ of the (n−4)-th basic circuit 401-(*n*−4), which is input to a gate of a transistor T9A, becomes a high voltage level, the transistor T9A is turned on. Thereby, a voltage of the low voltage line $V_{GL}$ is applied to the node N1 via the transistor T9A, and the node N1 is maintained at a low voltage.

During the period P2, since the gate signal $G_{n-2}$ of the (n−2)-th basic circuit 401-(*n*−2), which is input to gates of a transistor T7 and a transistor T1, becomes a high voltage level, the transistor T7 and the transistor T1 are turned on. Thereby, the node N1 becomes a high voltage level and the node N2 becomes a low voltage level. The node N1 becomes a high voltage level, and thus a transistor T4 and a transistor T5 are turned on. Here, the transistor T4 is turned on, and in turn the node N2 becomes a low voltage level. In addition, at this time, since the clock Vm input to a source or a drain of the transistor T5 is in a low voltage level, the gate signal $G_n$ is in a low voltage level.

During the period P3, the clock Vm becomes an ON state. Here, the node N1 is in a high voltage level as described above, and thus the transistor T5 is turned on. Thereby, the gate signal $G_n$ becomes a high voltage level by the clock Vm, and then is output from the output terminal OUT. At this time, the node N1 becomes a higher voltage level due to capacitance coupling of a boost capacitor C1 connected between the gate and the source or the drain of the transistor T5.

During the period P4, since the gate signal $G_{n+2}$ of the (n+2)-th basic circuit 401-(*n*+2), which is input to a gate and a source or a drain of a transistor T1A, becomes a high voltage level, the transistor T1A and the transistor T7A are turned on. Thereby, the node N2 is maintained at a low voltage and the node N1 is maintained at a high voltage.

During the period P5, since the gate signal $G_{n+4}$ of the (n+4)-th basic circuit 401-(*n*+4), which is input to a transistor T9, becomes a high voltage level, the transistor T9 is turned on, and the node N1 becomes a low voltage level. In addition, since the clock $V_{m+4}$ becomes an ON state, a transistor T3 to which the clock $V_{m+4}$ is input is turned on, and the node N2 becomes a high voltage level. If the node N2 becomes a high voltage level, the transistor T6 is turned on, and thus the gate signal $G_n$ is maintained at a low voltage. Further, the high voltage of the node N2 is maintained at a high voltage by a capacitor C3 connected between the low voltage line $V_{GL}$ and the node N2.

Next, an operation of the gate circuits 201 and 202 in a case of backward scanning will be described with reference to FIG. 7. In the same manner as FIG. 6, in FIG. 7, VST, VSTA, V1, V3, V5, and V7 indicate signals in the first gate circuit 201, and VST2, VST2A, V2, V4, V6, and V8 indicate signals used in the second gate circuit 202. In addition, in FIG. 7, N1 and N2 respectively indicate voltages of a node N1 and a node N2. Further, one graduation in the horizontal direction in FIG. 7 indicates one horizontal period corresponding to a writing period of a display voltage.

During the period P1, since the gate signal $G_{n+4}$ of the (n+4)-th basic circuit 401-(n+4) becomes a high voltage level, the transistor T9 is turned on, and the node N1 is maintained at a low voltage.

During the period P2, since the gate signal $G_{n+2}$ of the (n+2)-th basic circuit 401-(n+2) becomes a high voltage level, the transistor T1A and the transistor T7A are turned on. Thereby, the node N1 becomes a high voltage level. Since the node N1 becomes a high voltage level, the transistor T4 is turned on. Thereby, the node N2 becomes a low voltage level. In addition, since the transistor T7A is turned on, the node N2 is maintained at a low voltage.

During the period P3, the clock Vm becomes an ON state. Here, the node N1 is in a high voltage level as described above, and thus the transistor T5 is in a turned-on state. Thereby, the gate signal $G_n$ becomes a high voltage level by the clock Vm, and then is output from the output terminal. At this time, the node N1 becomes a higher voltage level due to capacitance coupling of the boost capacitor C1.

During the period P4, since the gate signal $G_{n-2}$ of the (n-2)-th basic circuit 401-(n-2) becomes a high voltage level, the transistor T1 and the transistor T7A are turned on. Thereby, the node N2 is maintained at a low voltage and the node N1 is maintained at a high voltage.

During the period P5, since the gate signal $G_{n-4}$ of the (n-4)-th basic circuit 401-(n-4) becomes a high voltage level, the transistor T9A is turned on, and the node N1 becomes a low voltage level. In addition, since the clock $V_{m+4}$ becomes an ON state, the transistor T3 is turned on, and the node N2 becomes a high voltage level. When the node N2 becomes a high voltage level, the transistor T6 is turned on, and the gate signal $G_n$ is maintained at a low voltage. Thereafter, the high voltage of the node N2 is maintained at a high voltage by the capacitor C3.

In addition, the auxiliary signals $V_{ST}$ and the like are input, as described above, to the dummy circuits (the basic circuits 401 in the first and second stages from the above and the below, included in each of the gate circuits 201 and 202) of the basic circuits 401 included in each of the gate circuits 201 and 202, in a case where there are no gate signal outputs from the (n-4)-th basic circuit 401, the (n-2)-th basic circuit 401, the (n+2)-th basic circuit 401, or the (n+4)-th basic circuit 401. In addition, in the claims, for example, the (k-2)-th basic circuit corresponds to the (n-4)-th basic circuit 401, the (k-1)-th basic circuit corresponds to the (n-2)-th basic circuit 401, the (k+1)-th basic circuit corresponds to the (n+2)-th basic circuit 401, and the (k+2)-th basic circuit corresponds to the (n+4)-th basic circuit 401.

Next, there will be made a description of output timings of the gate signals output from each of the gate circuits 201 and 202 disposed at both sides of the display portion 203.

As described above, in a case of the forward scanning, the first gate circuit 201 sequentially outputs the gate signals G1, G3, G5, to the first, third, fifth, gate lines 105. On the other hand, the second gate circuit 202 sequentially outputs the gate signals G2, G4, G6, to the second, fourth, sixth, gate lines 105.

Here, in the present embodiment, in the adjacent gate lines 105, output timings of the gate signals from one of the gate circuits 201 and 202 differentiate from output timings of the gate signals from the other of the gate circuits 201 and 202 such that timings when the gate signals are output are not continued. In other words, in a case where a gate signal (high voltage) is output to a certain gate line 105, a gate signal is not output to a gate line 105 adjacent to the certain gate line 105. That is, output timings of the gate signals from one of the gate circuits 201 and 202 differentiate from output timings of the gate signals from the other of the gate circuits 201 and 202 such that the adjacent gate line 105 becomes a low voltage level.

Specifically, for example, in a case of the forward scanning, as shown in FIG. 6, the second gate circuit 202 starts to output an initial gate signal (corresponding to a gate signal output to the second gate line 105) after one horizontal period from a time point when the first gate circuit 201 starts to output a third gate signal (corresponding to a gate signal output to the fifth gate line 105). In addition, in one or more embodiments of the present invention a timing when the gate line 105 in the above-described state is in a high voltage level is not continued in a gate line 105 adjacent to the corresponding gate line 105. Thus, for example, the second gate circuit 202 may start to output an initial gate signal (corresponding to a gate signal output to the second gate line 105) after one horizontal period from a time point when the first gate circuit 201 starts to output a fourth gate signal (corresponding to a gate signal output to the seventh gate line 105).

In addition, at this time, an order for outputting corresponding data signals is changed using a RAM or the like in the driver according to the period when the corresponding gate signal is in a high voltage level. In other words, in the example shown in FIG. 6, for example, a second data signal, which corresponds to a gate signal output to the second gate line 105, is output not during 1H after the first gate signal is output but during 1H after a gate signal output to the fifth gate line 105 is output.

Figure 7:
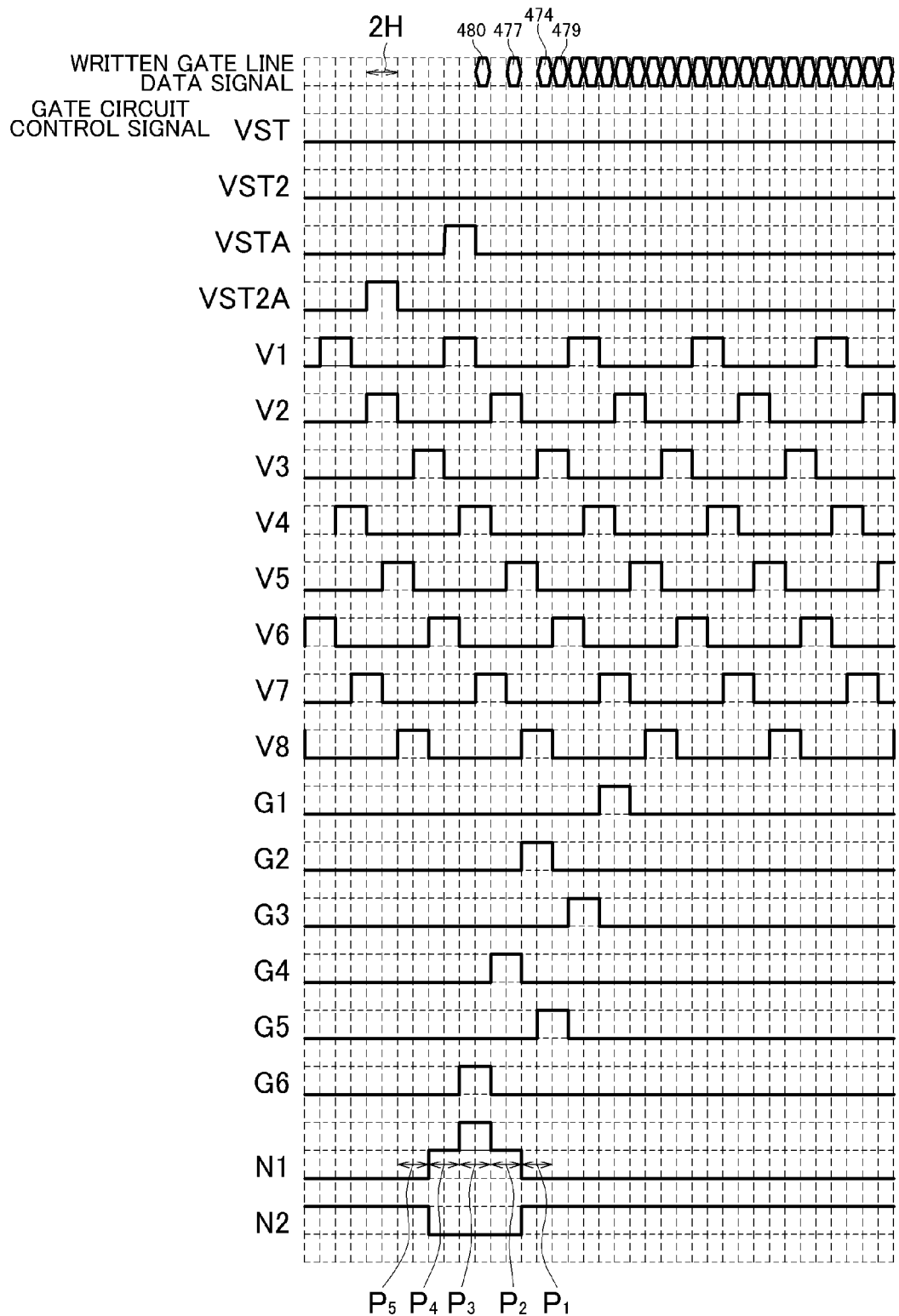
FIG. 7 is a diagram illustrating a timing chart when the gate circuit performs backward scanning according to the embodiment of the present invention.

Similarly, in the case with the backward scanning, as shown in FIG. 7, in the adjacent gate lines 105, output timings of the gate signals from one of the gate circuits 201 and 202 differentiate from output timings of the gate signals from the other of the gate circuits 201 and 202 such that timings when the gate signals are output are not continued. In addition, this case is the same as the case of the forward scanning except for the backward scanning in which a gate signal corresponding to the lowermost gate line 105 starts to be output, and thus a detailed description thereof will be omitted.

As described above, in the adjacent gate lines 105, output timings of the gate signals from one of the gate circuits 201 and 202 differentiate from output timings of the gate signals from the other of the gate circuits 201 and 202 such that timings when the gate signals are output are not continued. Specifically, for example, in a case of the forward scanning, when a high voltage of the auxiliary signal $V_{ST}$ or $V_{ST2}$ corresponding to a start pulse is input to $G_{n-2}$, the node N1 becomes an ON state, and thus scanning can be started. Therefore, output timings of the right and left gate circuits can be differentiated such that the timings are not continued in the adjacent gate lines 105 by controlling the high voltage of the auxiliary signal $V_{ST}$ or $V_{ST2}$.

Accordingly, periods when the gate signals (high voltage) are output do not match each other in the adjacent gate lines 105, and thus it is possible to suppress pixel potential variations when potentials of the adjacent gate lines 105 are varied from a high voltage to a low voltage.

Specifically, according to one or more embodiments of the present embodiment, a potential of the pixel electrode 135 is reduced by the voltage $V_1$ due to the parasitic capacitor $C_{gp1}$ present between the gate electrode 131 and the pixel electrode 135 included in a single pixel circuit 130 described using the example shown in FIGS. 15 and 16. However, particularly in the backward operation, it is possible to effectively suppress the reduction of the voltage $V_2$ due to the parasitic capacitor $C_{gp2}$ present between the gate electrode 131 and the pixel electrode 135 of the pixel electrode 130 adjacent to the single pixel electrode 130. As a result, it is possible to realize a high image quality display device with the gate circuit performing bidirectional scanning. Particularly, for example, in a display device employing an IPS-Pro type with no organic film, since it has a structure without using a low permittivity organic protective film, the parasitic capacitor $C_{gp1}$ and the parasitic capacitor $C_{gp2}$ have large capacitance, and thus effects achieved by one or more embodiments of the present embodiment are great.

In addition, in the present embodiment, for example, the gate lines 105, in which the high voltages overlap each other, exist like the second gate line 105 and the fifth gate line 105 in FIGS. 6 and 7. However, parasitic capacitance present between the gate electrode 131 and the pixel electrode 110 in this case is much smaller than the parasitic capacitance between the adjacent pixel circuits since a distance between the second and fifth pixel circuits is much longer than a distance between the adjacent pixel circuits. Therefore, a reduction in the voltage of the pixel electrode 110 due to this is very small, and thus there is little influence.

Modified Example

Next, a modified example of the present invention will be described. The modified example is different from the embodiment explained above in that overlap driving of three horizontal periods is performed, three gate circuits are used according thereto, and the three gate circuits are divided and disposed at left and right sides. In addition, in the following, description of the similar configuration as in the embodiment will be omitted.

Figure 8:
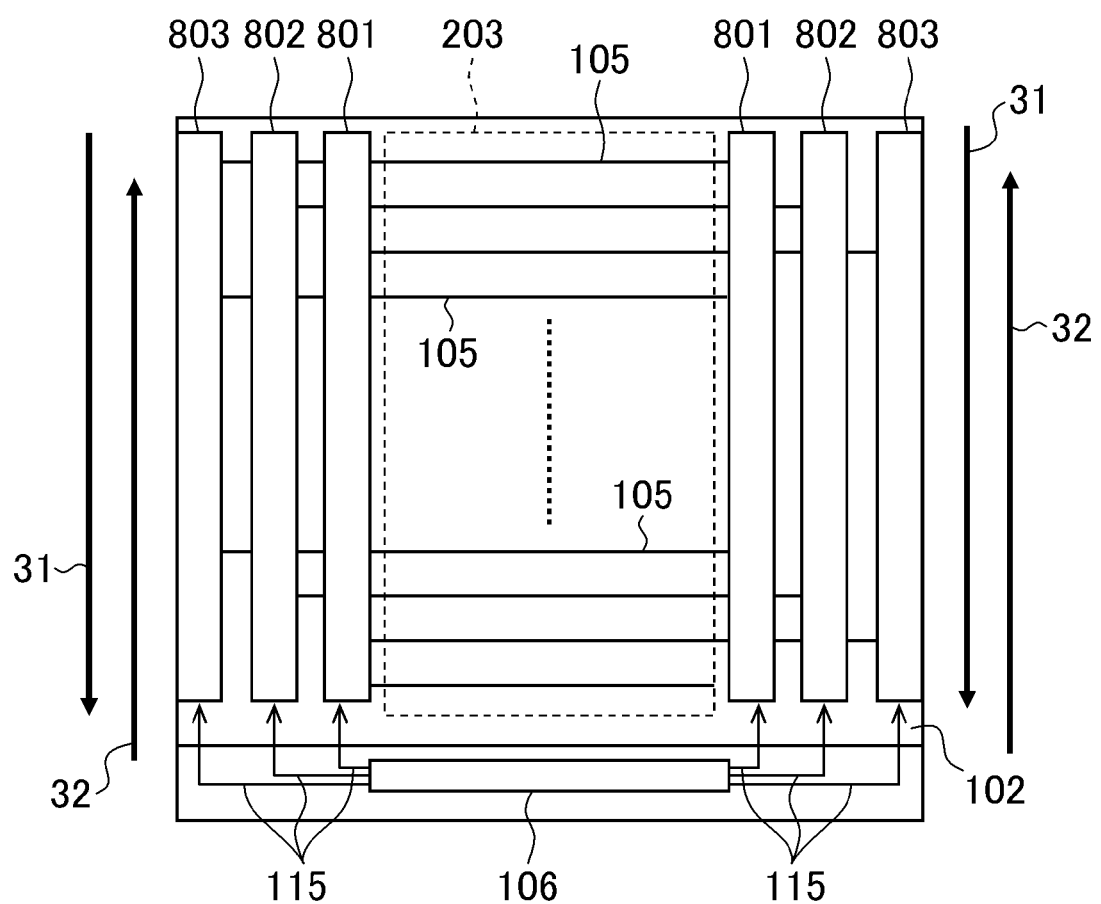
FIG. 8 is a diagram illustrating an outline of disposition of the gate circuit according to a modified example of the present invention.

FIG. 8 is a diagram illustrating an outline of disposition of the gate circuits according to the modified example. In the same manner as the embodiment, a display device 800 according to the modified example includes a display portion 203, a driver 106, and gate circuits 801, 802 and 803. However, in the gate circuits 801, 802 and 803 according to the modified example, for example, in a case of forward scanning, the first gate circuits 801 output a gate signal to the k-th gate line 105, the second gate circuits 802 output a gate signal to the (k+1)-th gate line 105, and the third gate circuits 803 output a gate signal to the (k+2)-th gate line 105. Here, k is a natural number. For example, in the first to third gate circuits 801, 802 and 803 which are divided and disposed at the left and right sides, one of the gate circuits 801, 802 and 803 of the left and right sides outputs a first gate signal, and then the other of the gate circuits 801, 802 and 803 outputs a second gate signal. In addition, a case of backward scanning is the same as the above description except that gate signals are output in a reverse order, and thus description thereof will be omitted.

Specifically, for example, in a case of forward scanning, the first gate circuits 801 sequentially output gate signals to the first, fourth, seventh, gate lines 105, the second gate circuits 802 sequentially output gate signals to the second, fifth, eighth, gate lines 105, and the third gate circuits 803 sequentially output gate signals to the third, sixth, ninth, gate lines 105. In addition, for example, the first gate circuit 801 disposed at the right side of the first gate circuits 801 outputs a gate signal to the first gate line 105, and then the first gate circuit 801 disposed at the left side outputs a gate signal to the fourth gate line 105.

Figure 9:
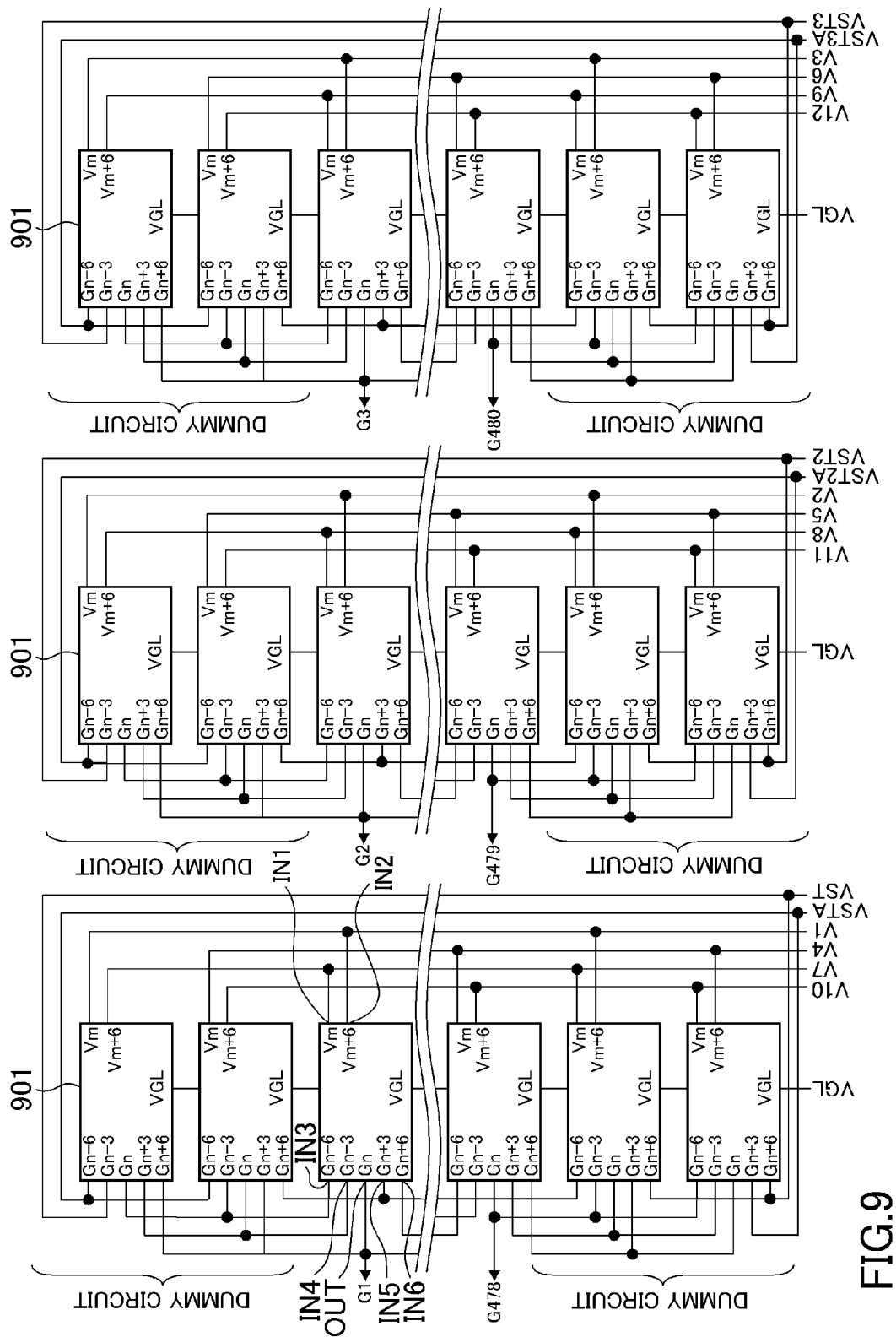
FIG. 9 is a diagram illustrating a configuration of the gate circuit according to the modified example of the present invention.

FIG. 9 is a diagram illustrating a configuration of the gate circuit. In the same manner as the above-described embodiment, each basic circuit 901 has input terminals IN1, IN2, IN3, IN4, IN5 and IN6, and an output terminal OUT. The driver 106 inputs the control signals 115 to the input terminals IN1 and IN2.

Here, the control signals 115 include basic clock signals $V_1, V_4, V_7$ and $V_{10}$ which are input to the first gate circuit 801 and have different phases of four phases, a low voltage line $V_{GL}$, and auxiliary signals $V_{ST}$ and $V_{ST4}$. In addition, the control signals 115 include basic clock signals $V_2, V_5, V_8$ and $V_{11}$ which are input to the second gate circuit 802 and have different phases of four phases, a low voltage line $V_{GL}$, and auxiliary signals $V_{ST2}$ and $V_{ST2A}$. Further, the control signals 115 include, for example, basic clock signals $V_3, V_6, V_9$ and $V_{12}$ which are input to the third gate circuit 803 and have different phases of four phases, a low voltage line $V_{GL}$, and auxiliary signals $V_{ST3}$ and $V_{ST3A}$.

Basic clock signals $V_m$ and $V_{m+6}$ are respectively input to the input terminals IN1 and IN2 of the n-th basic circuits 901-$n$. In addition, a gate signal $G_{n-3}$ from the (n−3)-th basic circuits 901-($n$−3) is input to the input terminal IN3 of the n-th basic circuits 901-$n$, and a gate signal $G_{n-6}$ from the (n−6)-th basic circuits 901-($n$−6) is input to the input terminal IN4 thereof. In addition, a gate signal $G_{n+3}$ from the (n+3)-th basic circuits 901-($n$+3) is input to the input terminal IN5 of the n-th basic circuits 901-$n$, and a gate signal $G_{n+6}$ from the (n+6)-th basic circuits 901-($n$+6) is input to the input terminal IN6 thereof. Here, the n-th basic circuit corresponds to a basic circuit 901 outputting a gate signal to the n-th gate line 105.

Since there are no gate signals corresponding to the input terminals IN3 and IN4 of the first basic circuit 901 (a basic circuit 901 located at the uppermost part of the figure) of plural basic circuits 901 included in the first gate circuits 801, the auxiliary signals $V_{ST4}$ and $V_{ST}$ are respectively input thereto. In addition, in the same manner, since there is no gate signal corresponding to the input terminal IN3 of the second basic circuit 901, the auxiliary signal $V_{ST4}$ is input thereto. Since there are no gate signals corresponding to the input terminals IN5 and IN6 of the last basic circuit 901 (a basic circuit located at the lowermost part of the figure) of plural basic circuits 901 included in each of the gate circuits 801, 802 and 803, the auxiliary signals $V_{ST4}$ and $V_{ST}$ are respectively input thereto. In addition, in the same manner, since there is no gate signal corresponding to the input terminal IN6 of the second basic circuit 901 from the last, the auxiliary signal $V_{ST}$ is input thereto. This is also the same for the second gate circuit 802 and the third gate circuit 803, and thus description thereof will be omitted. In FIG. 9, such basic circuits 901 are indicated by dummy circuits in the above meaning.

Figure 10:
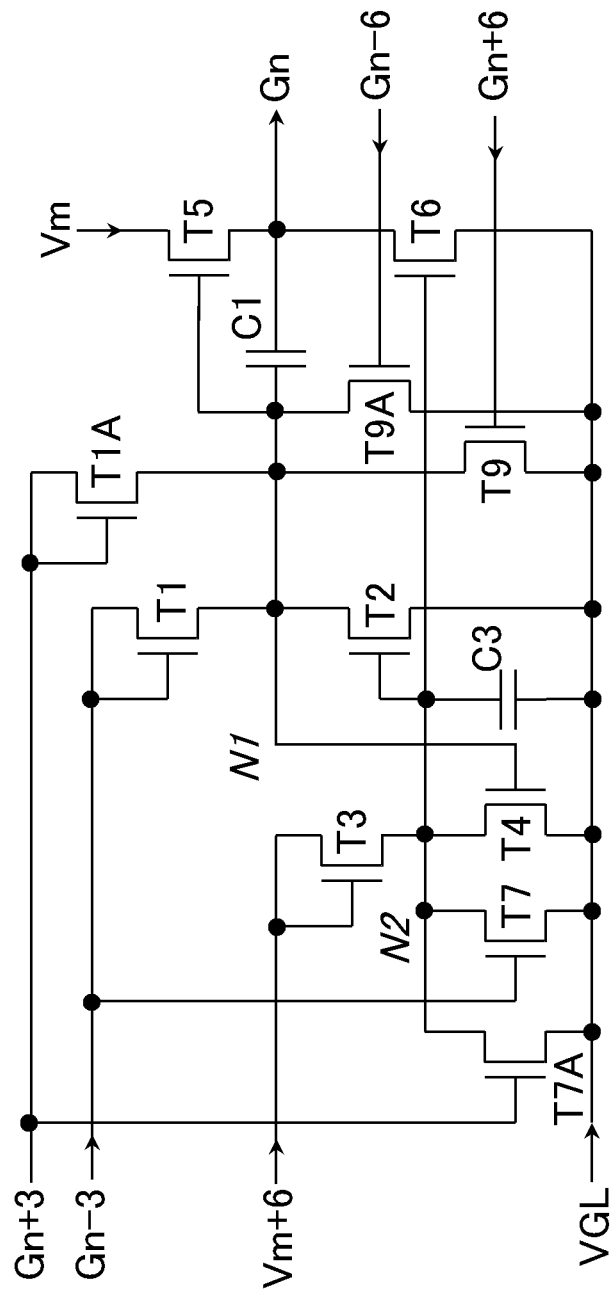
FIG. 10 is a diagram illustrating an example of the configuration of the n-th basic circuit according to the modified example of the present invention.
Figure 11:
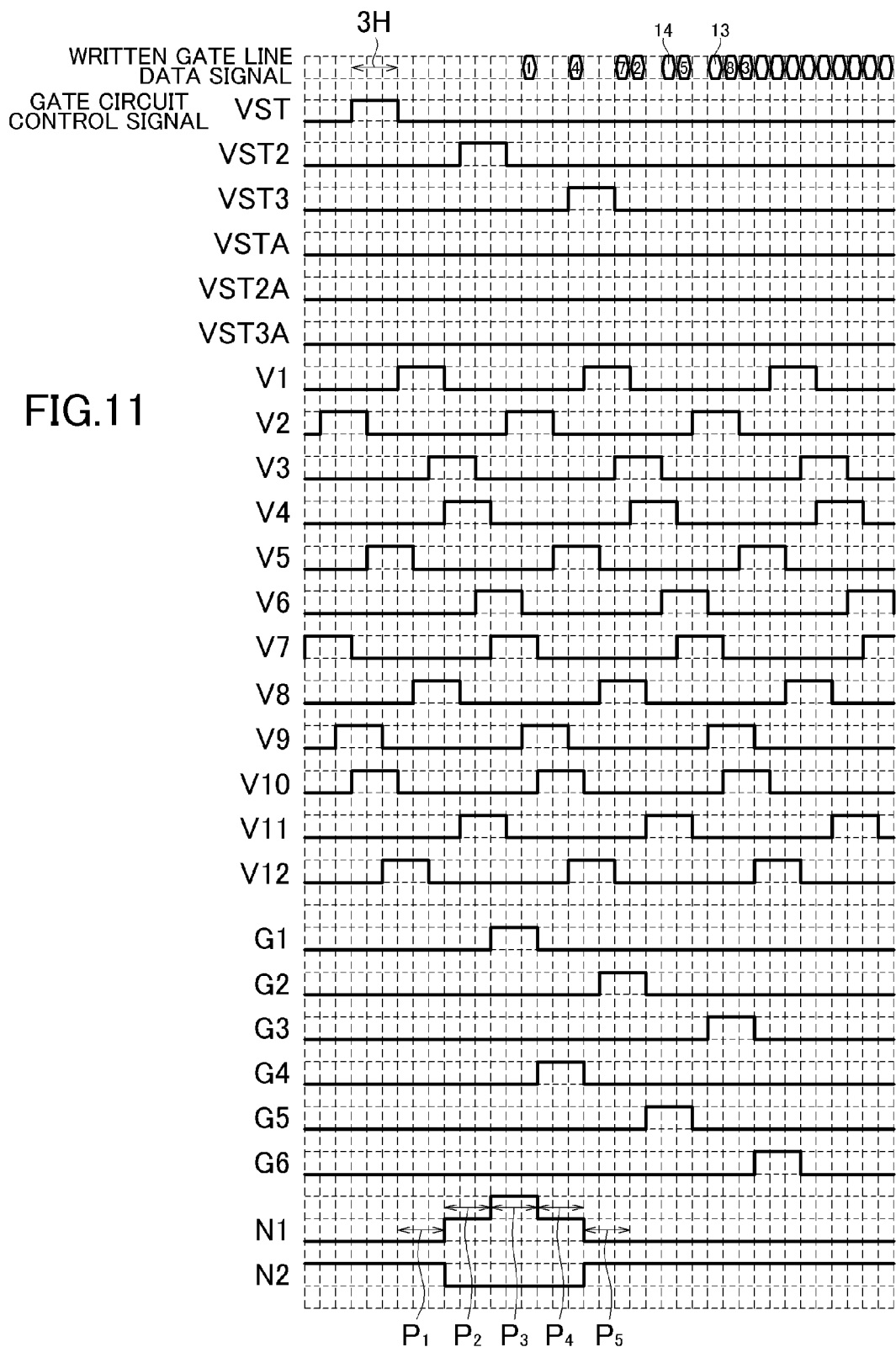
FIG. 11 is a diagram illustrating a timing chart when the gate circuit performs forward scanning according to the modified example of the present invention.

Next, a configuration and an operation of the n-th basic circuit outputting a gate signal to the n-th gate line 105 will be described with reference to FIGS. 10 and 11. FIG. 10 is a diagram illustrating an example of the configuration of the n-th basic circuit. FIG. 11 is a diagram illustrating a timing chart when the gate circuits 801, 802 and 803 perform forward scanning. In FIG. 11, VST, VSTA, V1, V4, V7, and V10 indicate signals in the first gate circuit 801, VST2, VST2A, V2, V5, V8, and V11 indicate signals used in the second gate circuit 802, and VST3, VST3A, V3, V6, V9, and V12 indicate signals used in the third gate circuit 803. In addition, N1 and N2 respectively indicate voltages of a node N1 and a node N2. G1 to G6 respectively indicate gate signals output to the first to sixth gate lines 105. In addition, one graduation in FIG. 11 corresponds to one horizontal period. Details of the signals will be described later.

First, a case where each of the gate circuits 801, 802 and 803 perform forward scanning will be described. During the period P1, since the gate signal $G_{n-6}$ of the (n−6)-th basic circuit 901-(n−6) becomes a high voltage level, the transistor T9A is turned on. Thereby the node N1 is maintained at a low voltage.

During the period P2, since the gate signal $G_{n-3}$ of the (n−3)-th basic circuit 901-(n−3) becomes a high voltage level, the transistor T7 and the transistor T1 are turned on. Thereby, the node N1 becomes a high voltage level. The node N1 becomes a high voltage level, and thus the transistor T4 and the transistor T5 are turned on. Thereby, the node N2 becomes a low voltage level. In addition, at this time, since the clock Vm is in a low voltage level, the gate signal $G_n$ is in a low voltage level.

During the period P3, the clock Vm becomes an ON state. Here, the node N1 is in a high voltage level as described above, and thus the transistor T5 is turned on. Thereby, the gate signal $G_n$ becomes a high voltage level by the clock Vm, and then is output from the output terminal. At this time, the node N1 becomes a higher voltage level due to capacitance coupling of the boost capacitor C1.

During the period P4, since the gate signal $G_{n+3}$ of the (n+3)-th basic circuit 901-(n+3) becomes a high voltage level, the transistor T1A and the transistor T7A are turned on. Thereby, the node N2 is maintained at a low voltage and the node N1 is maintained at a high voltage.

During the period P5, since the gate signal $G_{n+6}$ of the (n+6)-th basic circuit 901-(n+6) becomes a high voltage level, the transistor T9 is turned on, and the node N1 becomes a low voltage level. In addition, since the clock $V_{m+6}$ becomes an ON state, the transistor T3 is turned on, and the node N2 becomes a high voltage level. If the node N2 becomes a high voltage level, the transistor T6 is turned on, and thus the gate signal $G_n$ is maintained at a low voltage. Further, the high voltage of the node N2 is maintained at a high voltage by the capacitor C3.

Next, an operation of the basic circuits in a case of backward scanning will be described with reference to FIG. 12. In the same manner as FIG. 11, in FIG. 12, VST, VSTA, V1, V4, V7, and V10 indicate signals in the first gate circuit 801, VST2, VST2A, V2, V5, V8, and V11 indicate signals used in the second gate circuit 802, and VST3, VST3A, V3, V6, V9, and V12 indicate signals used in the third gate circuit 803. In addition, N1 and N2 respectively indicate voltages of a node N1 and a node N2. In addition, in the same manner, one graduation in FIG. 12 corresponds to one horizontal period. Details of the signals will be described later.

During the period P1, since the gate signal $G_{n+6}$ of the (n+6)-th basic circuit 901-(n+6) becomes a high voltage level, the transistor T9 is turned on, and the node N1 is maintained at a low voltage.

During the period P2, since the gate signal $G_{n+3}$ of the (n+3)-th basic circuit 901-(n+3) becomes a high voltage level, the transistor T1A and the transistor T7A are turned on. Thereby, the node N1 becomes a high voltage level. Since the node N1 becomes a high voltage level, the transistor T4 is turned on. Thereby, the node N2 becomes a low voltage level. In addition, since the transistor T7A is turned on, the node N2 is maintained at a low voltage.

During the period P3, the clock Vm becomes an ON state. Here, the node N1 is in a high voltage level as described above, and thus the transistor T5 is turned on. Thereby, the gate signal $G_n$ becomes a high voltage level by the clock Vm, and then is output from the output terminal. At this time, the node N1 becomes a higher voltage level due to capacitance coupling of the boost capacitor C1.

During the period P4, since the gate signal $G_{n-3}$ of the (n−3)-th basic circuit 901-(n−3) becomes a high voltage level, the transistor T1 and the transistor T7A are turned on. Thereby, the node N2 is maintained at a low voltage and the node N1 is maintained at a high voltage.

During the period P5, since the gate signal $G_{n-6}$ of the (n−6)-th basic circuit 901-(n−6) becomes a high voltage level, the transistor T9A is turned on, and the node N1 becomes a low voltage level. In addition, since the clock $V_{m+6}$ becomes an ON state, the transistor T3 is turned on, and the node N2 becomes a high voltage level. When the node N2 becomes a high voltage level, the transistor T6 is turned on, and the gate signal $G_n$ is maintained at a low voltage. Thereafter, the high voltage of the node N2 is maintained at a high voltage by the capacitor C3.

In addition, the auxiliary signals $V_{ST}$ and the like are input, as described above, to the dummy circuits (the basic circuits in the first and second stages from the above and the below, included in each of the gate circuits 801, 802 and 803) of the basic circuits included in each of the gate circuits 801, 802 and 803, in a case where there are no gate signal outputs from the (n−6)-th basic circuit, the (n−3)-th basic circuit, the (n+3)-th basic circuit, or the (n+6)-th basic circuit. In addition, in the claims, for example, the (k−2)-th basic circuit corresponds to the (n−6)-th basic circuit 401, the (k−1)-th basic circuit corresponds to the (n−3)-th basic circuit 401, the (k+1)-th basic circuit corresponds to the (n+3)-th basic circuit 401, and the (k+2)-th basic circuit corresponds to the (n+6)-th basic circuit 401.

Next, it will be explained regarding output timings of the gate signals that are output from each of the gate circuits 801 to 803 disposed at both sides of the display portion 203.

As described above, in a case of forward scanning, the first gate circuits 801 sequentially output gate signals G1, G4, G7, to the first, fourth, seventh, gate lines 105. The second gate circuits 802 sequentially output gate signals G2, G5, G8, to the second, fifth, eighth, gate lines 105. The third gate circuits 803 sequentially output gate signals G3, G6, G9, to the third, sixth, ninth, gate lines 105.

Here, in the adjacent gate lines 105, output timings of the gate signals from the gate circuits 801, 802 and 803 are adjusted such that timings when the gate signals are output are not continued. In other words, in a case where a gate signal (high voltage) is output to a certain gate line 105, output timings of the gate signals from the gate circuits 801, 802 and 803 are adjusted such that a gate signal is not output to a gate line 105 adjacent to the certain gate line 105, that is, the adjacent gate line 105 becomes a low voltage level.

Specifically, for example, in a case of the forward scanning, as shown in FIG. 11, the second gate circuit 802 starts to output an initial gate signal (corresponding to a gate signal output to the second gate line 105) after one horizontal period from a time point when the first gate circuit 801 starts to output a third gate signal (corresponding to a gate signal output to the seventh gate line 105), and the third gate circuit 803 starts to output an initial gate signal (corresponding to a gate signal output to the third gate line 105) after one horizontal period from a time point when the second gate circuit 802 starts to output a third gate signal (corresponding to a gate signal output to the eighth gate line 105).

As explained above, in one or more embodiments of the present invention, a timing when a gate line 105 is in a high voltage level differentiates from the timing when the adjacent gate line 105 is in a high voltage. Thus, for example, the second gate circuit 802 may start to output an initial gate signal after one horizontal period from a time point when the first gate circuit 801 starts to output a fourth gate signal.

In addition, at this time, an order for outputting corresponding data signals is changed using a RAM or the like in the driver according to the period when the corresponding gate signal is in a high voltage level. In other words, in the example shown in FIG. 11, for example, a data signal corresponding to a second gate signal may be output during 1H after a seventh gate signal is output.

Figure 12:
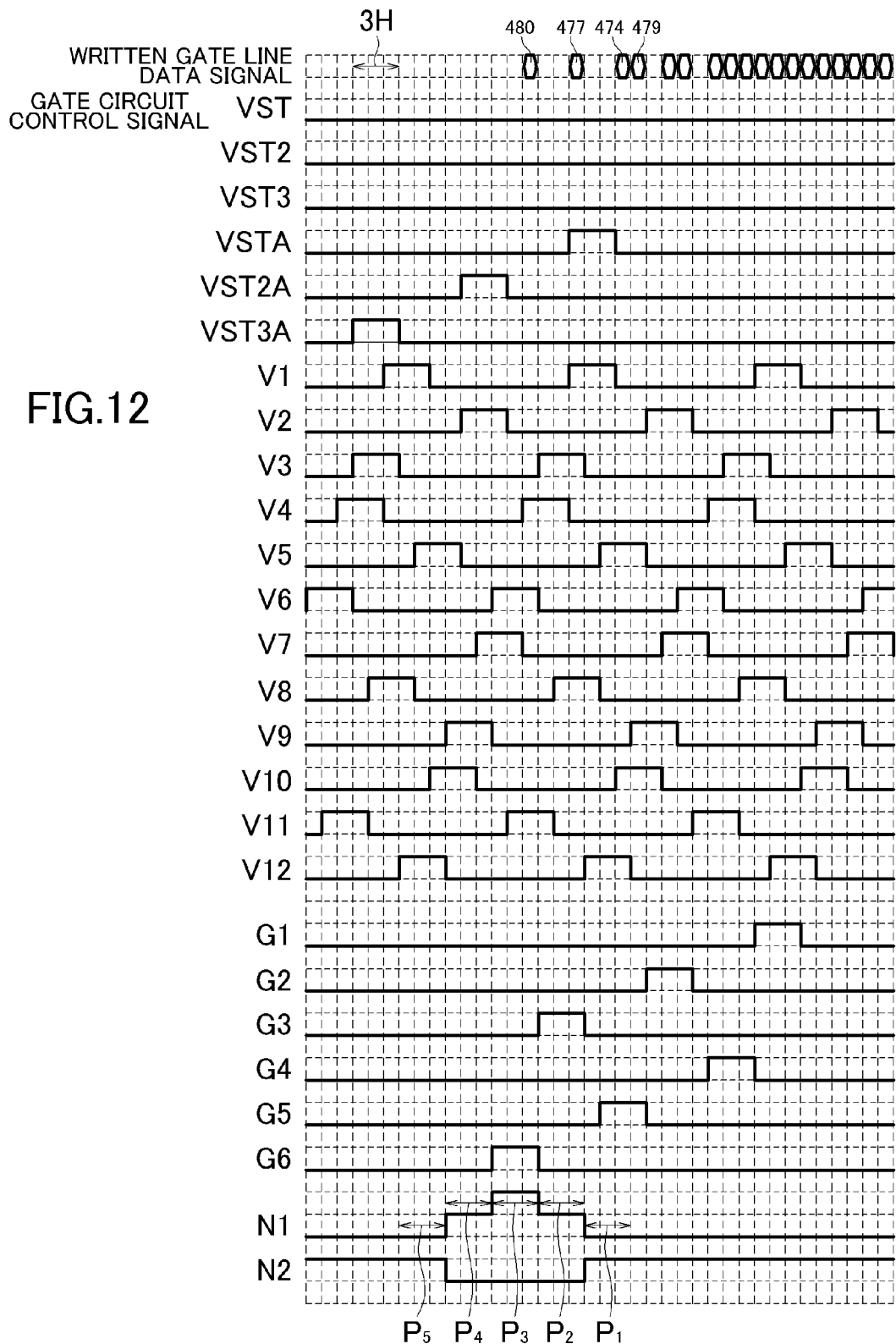
FIG. 12 is a diagram illustrating a timing chart when the gate circuit performs backward scanning according to the modified example of the present invention.
Figure 13:
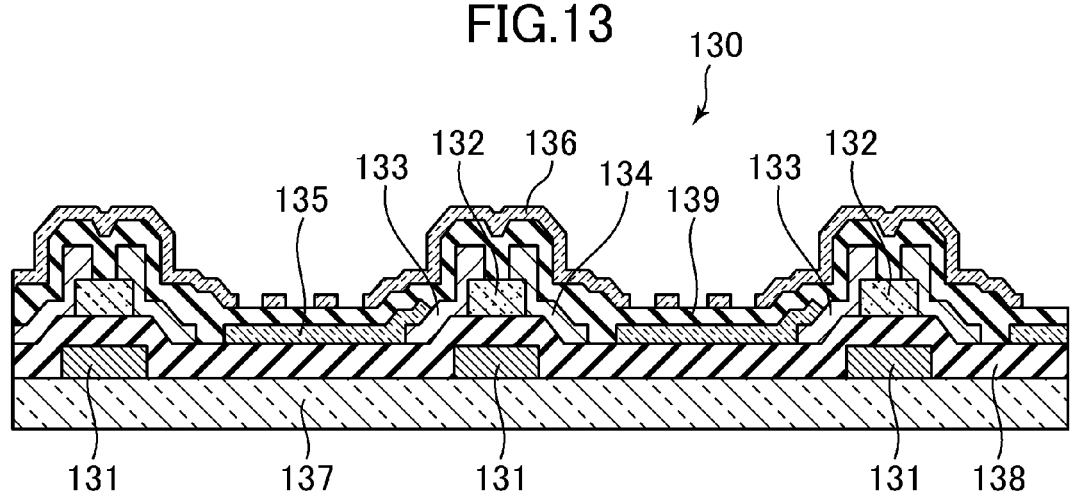
FIG. 13 is a diagram illustrating a task of the present invention.
Figure 14:
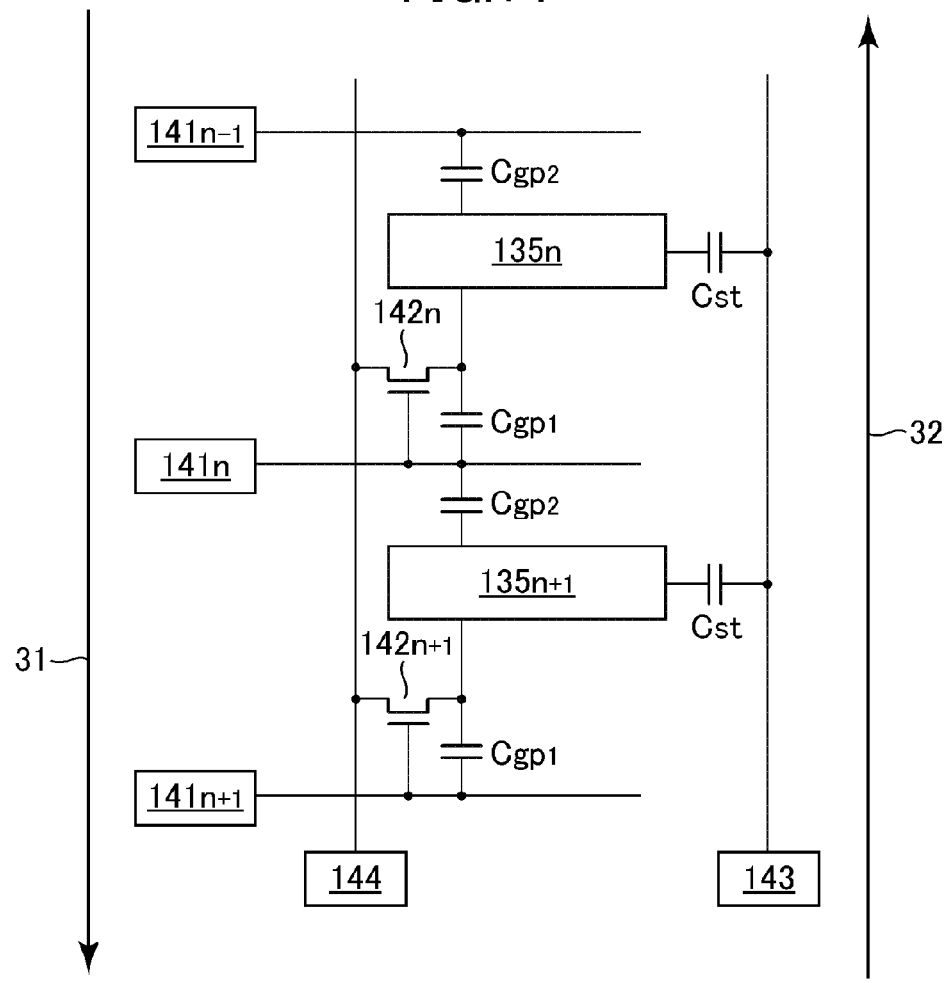
FIG. 14 is a diagram illustrating a task of the present invention.

Similarly, in the case with the backward scanning, as shown in FIG. 12, timings of starting to output the gate signals from the gate circuits 801, 802 and 803 are adjusted such that timings when the gate signals 105 becomes a high voltage level are not continued in the adjacent gate lines 105. In addition, this case is the same as the case of the forward scanning except for the backward scanning, and thus a detailed description thereof will be omitted.

As described above, according to the modified example, in the same manner as the above-described embodiment, periods when the gate signals (high voltage) are output do not match each other in the adjacent gate lines 105, and thus it is possible to suppress pixel potential variations when potentials of the adjacent gate lines 105 are varied from a high voltage to a low voltage.

The first to third gate circuits 801, 802 and 803 are divided and disposed at both sides of the display region, and thus areas of both sides of the display region can be the same in the TFT substrate. This is suitable for a case where the display device 800 is mounted on, for example, a mobile phone.

The present invention is not limited to the above-described embodiment or modified example, and may be variously modified, and may be replaced with configurations which are substantially the same as the configurations explained by the above-described embodiment or modified example, configurations achieving the same operations and effects, or configurations capable of achieving the same object.

For example, although a case of two-horizontal period or three-horizontal period overlap driving has been described in the above description, the present invention may be applied to a case of overlap driving of other horizontal periods, for example, four horizontal periods, five horizontal periods, and the like. In these cases, when one horizontal period overlap driving is performed, in each basic circuit, the node N2 becomes a high voltage level according to a high voltage of a (m+2*l)-th clock signal. Here, l is a natural number equal to or more than 2. Although the configuration where the gate circuits 801, 802 and 803 are divided and disposed at both sides of the display portion 203 has been described in the modified example, other dispositions may be used. For example, the gate circuits 801, 802 and 803 may be disposed at one side of the left side or the right side without being divided.

In addition, in the above-described embodiment or modified example, so-called two-dot inversion driving may be performed. In this case, influence by a variation in a potential of the pixel electrode of the adjacent pixel circuit on the pixel electrode of a certain pixel circuit is canceled out. Therefore, it is possible to realize a higher image quality display device.

In addition, the display device according to the present invention may be a liquid crystal display of a VA (Vertically Aligned) type or a TN (Twisted Nematic) type as well as an IPS type, or may be an organic EL display device, or the like.

What is claimed is:

1. A display device comprising:
a plurality of pixel circuits each of which includes a transistor, a pixel electrode connected to the transistor, and a reference electrode disposed so as to be opposite to the pixel electrode, wherein the plurality of pixel circuits are arranged in a matrix;
a plurality of data lines respectively connected to the plurality of corresponding pixel circuits;
a plurality of gate lines respectively connected to the plurality of corresponding pixel circuits;
a data circuit configured to output data signals to the plurality of data lines;
a plurality of gate circuits each of which sequentially outputs a gate signal, which is in a high voltage level during two or more horizontal periods in a first order or in a second order that is reverse to the first order, wherein the number of the plurality of gate circuits is based on horizontal periods when the gate signals are output; and
a gate signal control circuit that controls each of the gate circuits and scans the plurality of gate lines,
wherein the gate signal control circuit controls each of the gate circuits to start to output the gate signals so as not to overlap periods when the gate signals are output to the adjacent gate lines,
wherein a first gate circuit is configured to output an i-th gate signal to an i-th gate line, and a second gate circuit is configured to output an (i+1)-th gate signal to an (i+1)-th gate line after at least 3 horizontal periods from a time when the first gate circuit stops outputting the i-th gate signal,
wherein the data circuit is configured to output data signals corresponding to the (i+1)-th gate line after at least one horizontal period after the second gate circuit starts to output the (i+1)-th gate signal to the (i+1)-th gate line, and
wherein the first gate circuit is configured to output an (i+2)-th gate signal to an (i+2)-th gate line between the time when the first gate circuit stops outputting the i-th gate signal and the second gate circuit starts outputting the (i+1)-th gate signal such that the first gate circuit stops outputting the (i+2)-th gate signal at a time before the second circuit starts outputting the (i+1)-th gate signal.

2. The display device according to claim 1, wherein each of the gate circuits includes:
the first gate circuit that sequentially outputs the gate signals to odd numbered gate lines of the plurality of gate lines; and
the second gate circuit that sequentially outputs the gate signals to even numbered gate lines of the plurality of gate lines,
wherein the second gate circuit starts to output the gate signals after the first gate circuit outputs a second gate signal.

3. The display device according to claim 1, wherein each of the gate circuits is connected to four clock signal lines to which clock signals of four phases are respectively input, the clock signals sequentially becoming a high voltage level in the first order or in the second order,
wherein each of the gate circuits includes a plurality of basic circuits that sequentially output the gate signal,
wherein where each of the gate circuits sequentially outputs the gate signals in the first order, and where the basic circuit outputting a k-th gate signal is a k-th basic circuit of the plurality of basic circuits, one of the four-phase clock signals is an m-th clock signal, and a period when the gate signal becomes a high voltage level is a horizontal period 1,
the k-th basic circuit includes:
a first transistor that controls a voltage of a first node depending on an output from a (k−1)-th basic circuit;
a second transistor that controls a second node to become a low voltage level when the first node is in a high voltage level;

a third transistor that applies a high voltage to an output terminal according to a high voltage level of the m-th clock signal;

a fourth transistor that controls a voltage of the first node depending on an output from a (k+2)-th basic circuit;

a fifth transistor that controls the second node to become a high voltage level according to a high voltage level of a (m+2*1)-th clock signal;

a sixth transistor that controls the output terminal to become a low voltage level when the second node is in a high voltage level;

a seventh transistor that controls a voltage of the first node depending on an output from a (k−2)-th basic circuit; and an eighth transistor that controls a voltage of the first node depending on an output from a (k+1)-th basic circuit.

4. The display device according to claim 3, wherein where each of the gate circuits sequentially outputs the gate signals in the first order, the first transistor controls the first node to become a high voltage level according to an output from the (k−1)-th basic circuit, and the fourth transistor controls the first node to become a low voltage level according to an output from the (k+2)-th basic circuit, and wherein where each of the gate circuits sequentially outputs the gate signals in the second order, the eighth transistor controls the first node to become a high voltage level according to an output from the (k+1)-th basic circuit, and the seventh transistor controls the first node to become a low voltage level according to an output from the (k−2)-th basic circuit.

5. The display device according to claim 3, wherein the n-th basic circuit further includes a bootstrap circuit that further increases a high voltage value of the first node according to a high voltage level of the m-th clock signal.

6. The display device according to claim 3, wherein the n-th basic circuit further includes a storage capacitor that stores a high voltage of the second node until the second node becomes a low voltage level.

* * * * *